(12) United States Patent  
Asaduzzaman et al.

(10) Patent No.: US 7,352,835 B1  
(45) Date of Patent: Apr. 1, 2008

(54) CLOCK DATA RECOVERY CIRCUITRY WITH DYNAMIC SUPPORT FOR CHANGING DATA RATES AND A DYNAMICALLY ADJUSTABLE PPM DETECTOR

(75) Inventors: Kazi Asaduzzaman, Milpitas, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 647 days.

(21) Appl. No.: 10/668,900

(22) Filed: Sep. 22, 2003

(51) Int. Cl.  
*H04L 7/02* (2006.01)

(52) U.S. Cl. ..................... 375/359; 375/371

(58) Field of Classification Search ........... 375/354, 375/355, 371, 373, 374, 375, 376, 327, 215, 375/359  
See application file for complete search history.

(56) References Cited

U.S. PATENT DOCUMENTS

| | | | |
|---|---|---|---|
| 5,512,860 A * | 4/1996 | Huscroft et al. | 331/1 A |
| 6,211,741 B1 * | 4/2001 | Dalmia | 331/11 |
| 6,397,042 B1 * | 5/2002 | Prentice et al. | 455/67.14 |
| 6,483,886 B1 | 11/2002 | Sung et al. | 375/376 |
| 6,631,144 B1 * | 10/2003 | Johansen | 370/516 |
| 6,650,140 B2 | 11/2003 | Lee et al. | 326/39 |
| 6,956,442 B2 * | 10/2005 | Groen et al. | 331/57 |
| 7,133,648 B1 * | 11/2006 | Robinson et al. | 455/88 |
| 2001/0033188 A1 | 10/2001 | Aung et al. | 327/141 |
| 2003/0052709 A1 | 3/2003 | Venkata et al. | 326/37 |
| 2004/0096013 A1 * | 5/2004 | Laturell et al. | 375/316 |
| 2005/0058222 A1 * | 3/2005 | Black et al. | 375/316 |

OTHER PUBLICATIONS

U.S. Appl. No. 10/059,014, filed Jan. 29, 2002, Lee et al.  
U.S. Appl. No. 10/273,899, filed Oct. 16, 2002, Venkata et al.  
U.S. Appl. No. 10/317,262, filed Dec. 10, 2002, Venkata et al.  
U.S. Appl. No. 10/454,626, filed Jun. 3, 2003, Lui et al.  
U.S. Appl. No. 10/349,541, filed Jan. 21, 2003, Venkata et al.  
U.S. Appl. No. 10/637,982, filed Aug. 8, 2003, Venkata et al.

* cited by examiner

*Primary Examiner*—Emmanuel Bayard  
(74) *Attorney, Agent, or Firm*—Ropes & Gray LLP

(57) ABSTRACT

Clock data recovery (CDR) circuitry can be provided with dynamic support for changing data rates caused by the interfacing of different protocols. The CDR circuitry, which operates in reference clock mode and data mode, can be controlled by two control signals that signal the CDR circuitry to automatically switch between reference clock mode and data mode, to operate only in reference clock mode, or to operate only in data mode. The control signals can be set by a programmable logic device (PLD), by circuitry external to the PLD, or by user input. A dynamically adjustable parts per million (PPM) detector can also be provided in the CDR circuitry to signal when processing of data during the reference clock mode is completed.

32 Claims, 7 Drawing Sheets

CLOCK DATA RECOVERY CIRCUITRY WITH DYNAMIC SUPPORT FOR CHANGING DATA RATES AND A DYNAMICALLY ADJUSTABLE PPM DETECTOR

BACKGROUND OF THE INVENTION

This invention relates to clock data recovery circuitry. More particularly, this invention relates to providing clock data recovery circuitry with dynamic support for changing data rates and a dynamically adjustable parts per million (PPM) detector.

An increasingly important type of signaling between devices is signaling in which the clock signal information is embedded in a serial data stream so that no separate clock signal needs to be transmitted. For example, data may be transmitted serially in "packets" of several successive serial data words preceded by a serial "header" that includes several training bits having a predetermined pattern of binary ones and zeros. The clock signal information is embedded in the data signal by the high-to-low and/or low-to-high transitions in that signal, which must have at least one high-to-low or low-to-high transition within a certain number of clock signal cycles. At the receiver the clock signal is "recovered" from the data signal. The clock signal is then used to recover the data from the data signal. For convenience herein this general type of signaling will be referred to generically as "clock data recovery" or "CDR" signaling.

CDR signaling is now being used in many different signaling protocols. These protocols vary with respect to such parameters as clock signal frequency, header configuration, packet size, data word length, number of parallel channels, etc. Such signaling protocols include (1) industry-standard forms such as XAUI, InfiniBand (IB), Fibre Channel (FC), Gigabit Ethernet, Packet Over SONET or POS-5, Serial RapidIO, etc., and (2) any of a wide range of non-industry-standard or "custom" forms that particular users devise for their own uses. Such custom protocols often have at least some features similar to industry-standard protocols, but deviate from industry standards in other respects.

A programmable logic device ("PLD") is a general-purpose integrated circuit device that is programmable to perform any of a wide range of logic tasks. Rather than having to design and build separate logic circuits for performing different logic tasks, general-purpose PLDs can be programmed in various different ways to perform those various logic tasks. Many manufacturers of electronic circuitry and systems find PLDs to be an advantageous way to provide various components of what they need to produce.

CDR signaling is an area in which it would be highly desirable to have the ability to use PLDs to avoid having to always design and build CDR circuitry (e.g., receivers) that are specific to each of the many different CDR protocols.

CDR circuitry is typically designed to run at a fixed data rate for a given protocol. As a result, support for a different data rate may be complicated and may require the CDR circuitry to be reset and reprogrammed with a different configuration. In view of the foregoing, it would be desirable to provide CDR circuitry that can operate at a fixed data rate for a given protocol and that can also adapt to changing data rates caused by the interfacing of different protocols.

CDR circuitry often includes a parts per million (PPM) detector (or frequency detector) that computes a frequency difference between a reference clock signal and a recovered clock signal produced by the CDR circuitry. The PPM detector, which usually has a fixed PPM setting (e.g., 100 PPM or 200 PPM), outputs a signal when the PPM detector detects a frequency difference that is at or within the fixed PPM setting. In some embodiments, the fixed PPM setting may be too small or too large to be effective due to, for example, different system requirements, different types of applications implemented on the system, varying reference clock frequencies associated with different protocols, and process variations. In view of the foregoing, it would further be desirable to provide CDR circuitry with a dynamically adjustable PPM detector.

SUMMARY OF THE INVENTION

In accordance with this invention, clock data recovery (CDR) circuitry is provided with dynamic support for changing data rates and a dynamically adjustable parts per million (PPM) detector. The CDR circuitry of this invention is preferably programmable in at least some respects and may either be included on an integrated circuit with other more traditional PLD circuitry, or it may be at least partly included on a separate integrated circuit. If the CDR circuitry is at least partly on a separate circuit, it may be configured to facilitate efficient coupling to a more traditional PLD integrated circuit (e.g., in a common package with the PLD).

The CDR circuitry in accordance with the invention preferably receives a separate, additional reference clock signal from the source of the CDR data signal to be processed or from another suitable reference clock signal source. The frequency of the reference clock signal has a known relationship to the clock frequency of the CDR data signal, but it does not have to be in phase with the CDR data signal. Because the separate reference clock signal is not required to have any particular phase relationship to the CDR data signal, there are no constraints regarding possible skew (i.e., phase shift) between the reference clock signal and the CDR data signal. However, there is typically a frequency threshold requirement between the reference clock signal and the CDR data signal. For example, for a given signaling protocol, the reference clock signal may need to be within 100 PPM of the CDR data signal. Different signaling protocols may have different frequency thresholds. The CDR circuitry uses the reference clock signal and the CDR data signal to recover the clock signal embedded in the CDR data signal. Various parameters used in this recovery of the CDR data signal clock are preferably programmable. The clock signal embedded in the CDR data signal may be used to deserialize the CDR data signal, again using preferably programmable parameters such as a word length parameter. The deserialized data may then be synchronized or buffered for processing in a different clock regime (e.g., in accordance with a clock signal in more traditional PLD circuitry that is associated with the CDR circuitry).

The CDR circuitry of this invention can be programmable to operate at a fixed data rate for a given protocol, to adapt to changing data rates caused by the interfacing of different protocols, or both. When the CDR circuitry operates at a fixed data rate, the CDR circuitry automatically switches between two modes of operation: reference clock mode and data mode. During reference clock mode, the CDR circuitry uses the reference clock signal for a given protocol to produce a recovered clock that is similar in phase and frequency to the phase and frequency of the reference clock signal. A parts per million (PPM) detector (or frequency detector) in the CDR circuitry computes a frequency difference between the reference clock frequency and the clock frequency produced by the CDR circuitry, and compares the frequency difference to a PPM setting. If the frequency difference is at or less than the PPM setting, an output signal is generated and the CDR circuitry automatically switches to data mode. During data mode, the CDR circuitry adjusts the phase of the recovered clock to align to the CDR data signal. The phase-adjusted recovered clock is used to recover the clock signal embedded in the CDR data signal, which is then used to recover the data from the CDR data signal. If a problem is detected during data mode (e.g., the recovered clock is no longer aligned to the CDR data signal), the CDR circuitry automatically switches back to reference clock mode so that the CDR circuitry can become retrained to the reference clock signal.

The CDR circuitry can be programmable to operate at a fixed data rate and to adapt to changing data rates using two control signals: a lock-to-reference (LTR) signal and a lock-to-data (LTD) signal. For example, when the LTR signal and the LTD signal are both set to logic 0, the CDR circuitry can be directed to operate at a fixed data rate where the CDR circuitry automatically switches between reference clock mode and data mode. When the LTR signal to set to logic 1 and the LTD signal is set to logic 0, the CDR circuitry can be directed to operate in reference clock mode. This can occur, for example, when the data rate changes (e.g., a different reference clock signal associated with a change in protocol is sent as input to the CDR circuitry), when a problem is detected during data mode, or at any other suitable time. When the LTR signal is set to logic 0 and the LTD signal to set to logic 1, the CDR circuitry can be directed to operate in data mode. This can occur, for example, when the frequency difference computed by the PPM detector is at or within the PPM setting or at any other suitable time. As a default, when the LTR signal and the LTD signal are both set to logic 1, the CDR circuitry can also be directed to operate in data mode. The LTR signal and LTD signal can be set by the PLD, by circuitry external to the PLD, by user input, or a combination of the same.

In a further embodiment, the CDR circuitry can be designed to provide a dynamically adjustable PPM detector. A dynamically adjustable PPM detector provides users with the flexibility to change the PPM setting in response to, for example, different system requirements, different applications implemented on the system, varying reference clock frequencies associated with different protocols, and process variations. The PPM setting can be set by the PLD, by circuitry external to the PLD, by user input, or a combination of the same.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION

Figure 1:
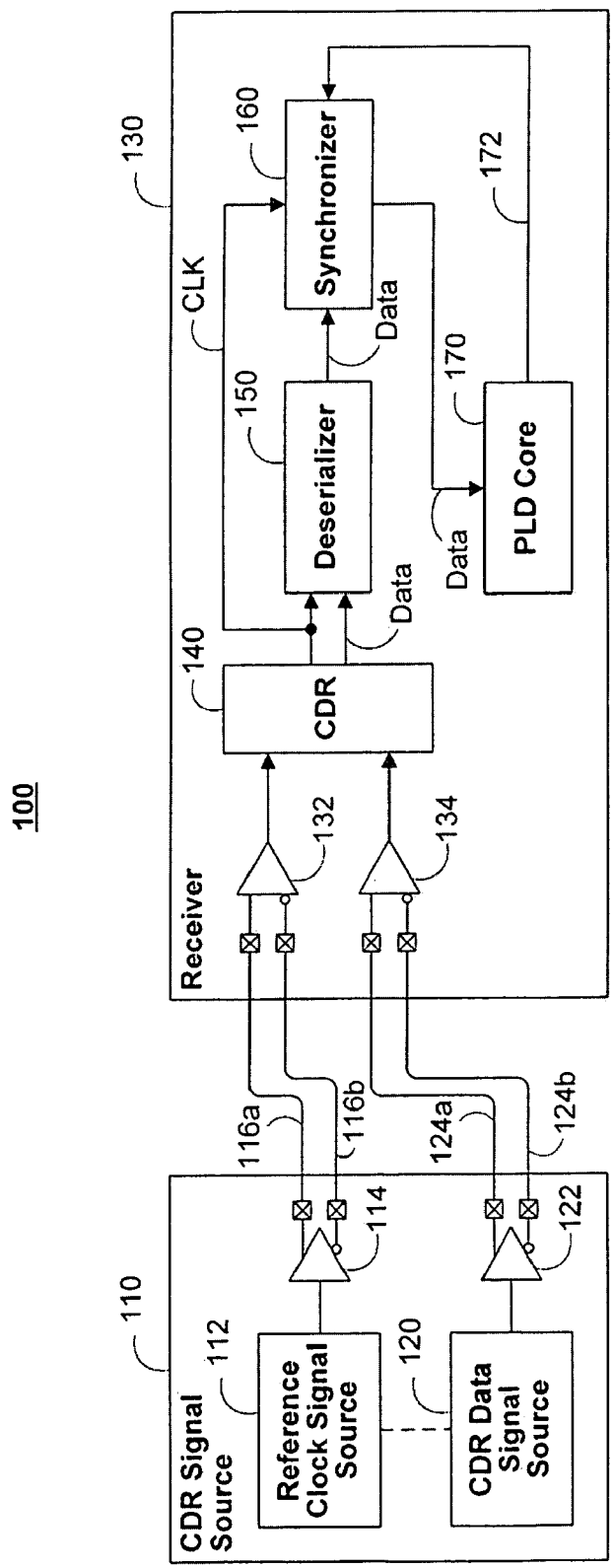
FIG. 1 is a simplified schematic block diagram of an illustrative embodiment of CDR signaling apparatus in accordance with the invention.

FIG. 1 shows an illustrative embodiment of CDR signaling apparatus 100 in accordance with the invention. This apparatus includes a CDR signal source 110 and a receiver 130. Although elements 110 and 130 could be on the same integrated circuit, that is generally not the case and they are more typically portions of separate integrated circuits or circuit assemblies. For example, in systems like those shown in FIG. 7, receiver 130 could be part of element 710/720, while source 110 could be part of any other element(s) 730, 740, 750, and/or 760.

CDR signal source 110 includes a reference clock signal source 112 and a CDR data signal source 120, which can be conventional or substantially conventional. Reference clock signal source 112 produces a reference clock signal having a frequency relationship to the clock frequency embedded in the CDR data signal produced by CDR data signal source 120. For example, reference clock signal source 112 can produce a reference clock signal having the same frequency as the clock frequency embedded in the CDR data signal or any convenient fraction or multiple of the embedded clock frequency. In particular, the reference clock signal frequency REFCLK is related to the embedded clock frequency EMBCLK by the following relationship:

$$REFCLK * W = EMBCLK,$$

where W is a convenient scale factor such as 0.5, 1, 2, 4, etc. There is typically a frequency threshold requirement between the output signals of elements 112 and 120: the reference clock signal (e.g., REFCLK or REFCLK*W) and the CDR data signal. For example, for a given signaling protocol, the reference clock signal may need to be within 100 PPM of the CDR data signal. Different signaling protocols may have different frequency thresholds. There does not, however, need to be any particular phase relationship between the output signals of elements 112 and 120.

The output signal of reference clock signal source 112 is applied to a conventional differential signaling driver 114 to produce a pair of differential REFCLK output signals on leads 116a and 116b. (This is optional. The reference clock signal can instead be transmitted between elements 110 and 130 as a single signal on a single lead if desired.)

As has been mentioned, CDR data signal source 120 can be a conventional source of a CDR data signal. That signal is applied to a conventional differential signaling driver 122 to produce a pair of differential CDR data output signals on leads 124a and 124b. (Once again, differential signaling for the CDR data signal is optional, and the CDR data signal can instead be transmitted between elements 110 and 130 via a single lead.)

At receiver 130 the differential REFCLK signals on leads 116a and 116b are applied to a conventional differential driver 132 in order to convert the received REFCLK signals back to a signal on a single lead for application to CDR circuitry 140. Similarly, the differential CDR data signals on leads 124a and 124b are applied to a conventional differential driver 134 in order to convert the received CDR data signals back to a signal on a single lead for application to CDR circuitry 140.

CDR circuitry 140 uses the received REFCLK signal and CDR data signal to recover a clock signal embedded in the CDR data signal which is then used to recover a data signal from the CDR data signal. The signals are applied to deserializer 150, which converts the applied serial data to parallel data. The parallel data signals are applied to synchronizer 160 in synchronism with the clock signal produced by CDR circuitry 140. Synchronizer 160 buffers the parallel data for ultimate application to PLD core 170 in synchronism with another clock signal 172 supplied to synchronizer 160 by PLD core 170.

In accordance with the invention, the CDR circuitry (e.g., circuitry 140 in receiver 130) can be programmable to operate at a fixed data rate for a given protocol, to adapt to changing data rates caused by the interfacing of different protocols, or both. When the CDR circuitry operates at a fixed data rate, the CDR circuitry automatically switches between two modes of operation: reference clock mode and data mode.

During reference clock mode, the CDR circuitry uses the reference clock signal for a given protocol to produce a recovered clock that is similar in phase and frequency to the phase and frequency of the reference clock signal. Once the recovered clock signal is produced, the CDR circuitry automatically switches to data mode. During data mode, the CDR circuitry adjusts the phase of the recovered clock to align to the CDR data signal. The phase-adjusted recovered clock is used to recover the clock signal embedded in the CDR data signal, which is then used to recover the data from the CDR data signal. If a problem is detected during data mode (e.g., the recovered clock is no longer aligned to the CDR data signal), the CDR circuitry automatically switches back to reference clock mode so that the CDR circuitry can become retrained to the reference clock signal.

The CDR circuitry typically includes a parts per million (PPM) detector, also known as a frequency detector, which can be used to indicate when the CDR circuitry has completed processing in reference clock mode. The PPM detector computes a frequency difference between the reference clock frequency and the clock frequency produced by the CDR circuitry, and compares the frequency difference to a PPM setting (e.g., 100 PPM, 200 PPM). The frequency difference, in PPM, can be computed by (1) taking the difference between the reference clock frequency (RCF) and the clock frequency produced by the CDR circuitry (CF), (2) dividing the difference by the reference clock frequency, and (3) dividing the result by one million as shown in the following equation:

$$\frac{(RCF - CF)/RCF}{1{,}000{,}000} \qquad (1)$$

If the frequency difference is at or less than the PPM setting, the PPM detector outputs a signal (e.g., sets the output to logic 1). The signal indicates when the clock signal produced by the CDR circuitry has a frequency similar to the frequency of the reference clock signal. For a fixed data rate, when the PPM detector outputs this signal, the CDR circuitry automatically switches from reference clock mode to data mode.

The CDR circuitry can be programmable to operate at a fixed data rate or to adapt to changing data rates using two control signals: a lock-to-reference (LTR) signal and a lock-to-data (LTD) signal. For example, when the LTR signal and the LTD signal are both set to logic 0, the CDR circuitry can be directed to operate at a fixed data rate where the CDR circuitry automatically switches between reference clock mode and data mode. When the LTR signal to set to logic 1 and the LTD signal is set to logic 0, the CDR circuitry can be directed to operate only in reference clock mode. This can occur, for example, when the data rate changes (e.g., a different reference clock signal associated with a change in protocol is sent as input to the CDR circuitry), when a problem is detected during data mode, or at any other suitable time. When the LTR signal is set to logic 0 and the LTD signal to set to logic 1, the CDR circuitry can be directed to operate only in data mode. This can occur, for example, when the frequency difference computed by the PPM detector is at or within the PPM setting or at any other suitable time. As a default, when the LTR signal and the LTD signal are both set to logic 1, the CDR circuitry can be directed to operate only in data mode or other suitable operation. In response to the changing data rates, the CDR circuitry may dynamically reset counters or may set circuitry to different values to assist with the change in data rate. For clarity, the CDR circuitry is primarily described herein as being controlled by two control signals, although any suitable number of signals and combinations of logic values, and any suitable control circuitry, may be used to control operation during reference clock mode and data mode.

The LTR signal and LTD signal can be programmed to be set by the PLD, by circuitry external to the PLD, by user input, or a combination of the same. In one embodiment, the PLD or external circuitry can be programmed to set the signals to indicate processing in reference clock mode when a new reference clock signal is detected (associated with a new protocol being interfaced), when a problem is detected during data mode, after a predetermined time period in which the CDR circuitry has been in data mode, or in response to any other suitable event. The PLD or external circuitry can further be programmed to set the signals to indicate processing in data mode when the PPM detector outputs a signal indicating a frequency difference at or within the PPM setting, after a predetermined time period in which the CDR circuitry has been in reference clock mode, or in response to any other suitable event. In another embodiment, the PLD or external circuitry can be programmed to set the signals to indicate processing at a fixed data rate when the CDR circuitry is to only operate at a fixed rate, or alternatively, after a predetermined time period in which the CDR circuitry has been operating at a given data rate if the CDR circuitry is to support changing data rates. Similarly, the user can set the signals under similar conditions in which the PLD or external circuitry can be programmed to set the signals or at any other suitable time or event.

In another embodiment of the invention, which can be used in conjunction with or separate from the CDR circuitry that supports a fixed data rate, changing data rates, or both, a dynamically adjustable PPM detector can provide users with the flexibility to change the PPM setting. The dynamically adjustable PPM detector advantageously provides for a universal CDR circuit that can support many different protocols, changing data rates associated with different protocols, and a fixed data rate for a given protocol. The dynamically adjustable PPM detector also allows a user to change the PPM settings to detect a frequency difference between a reference clock signal and a clock signal generated by the CDR circuitry over a wide range of frequencies. Furthermore, the PPM settings can be dynamically adjusted in response to, for example, different system requirements, different applications implemented on the system, and process variations.

The PPM detector has different uses for different applications of the CDR circuitry. For the CDR circuitry that supports a fixed data rate, the output of the PPM detector determines when the CDR circuitry automatically switches from in reference clock mode to data mode. For the CDR circuitry that supports a changing data rate, the output of the PPM detector can be monitored by a PLD, by circuitry external to the PLD, or by the user. In one embodiment, based on the output generated, the PLD, the external circuitry, or the user can dynamically set the LTR signal and LTD signal to direct the mode in which the CDR circuitry is to operate.

The PPM setting can be programmed to be set by the PLD, by circuitry external to the PLD, by user input, or a combination of the same. In one embodiment, the user may want to change the PPM setting to determine a minimum or a maximum frequency threshold with which the reference clock frequency can effectively differ from the frequency of the clock signal generated by the CDR circuitry. In another embodiment, the user may want to set a maximum PPM setting for a specific application of the CDR circuitry. In yet another embodiment, different data rates may require different PPM settings. For example, a high data rate (e.g., a CDR signal having a large frequency) may require a smaller PPM setting than the PPM setting for a low data rate (e.g., a CDR signal having a small frequency). If the PPM setting is too large, the PPM detector may output a signal indicating that the frequency difference between the reference clock frequency and the frequency of the clock signal generated by the CDR signal is within the PPM setting when in fact, the frequency of the clock signal is not sufficiently similar to the frequency of the reference clock signal. This may result in incorrect data being retrieved from the CDR signal during data mode. On the other hand, if the PPM setting is too low, the PPM detector may never output a signal indicating that the frequency difference between the reference clock frequency and the frequency of the clock signal generated by the CDR signal is within the PPM setting. This may result in the CDR circuitry never switching to data mode. The user can dynamically adjust the PPM detector by entering a new PPM setting, signaling an increase or decrease in the current PPM setting, or by any other suitable approach.

The PLD or external circuitry can also be programmed to dynamically adjust the PPM setting in response to various conditions using any suitable approach. In one embodiment, the PPM setting can be set to a particular value in response to detecting a change in the data rate. For example, each protocol may have an associated PPM setting that may be provided in a lookup table. In response to the CDR circuitry interfacing with a different protocol, the PLD or external circuitry may, based on the lookup table, set the PPM detector to the PPM setting corresponding to the new protocol. In another embodiment, if after a long predetermined time period the PPM detector does not output a signal, the PLD or external circuitry may increase the PPM setting by a predetermined increment. Similarly, if within a small predetermined time period the PPM detector outputs a signal, the PLD or external circuitry may decrease the PPM setting by a predetermined decrement. Limits may be set to the programmability of the PPM setting and these features may also be enabled or disabled by programmed conditions or alternatively by the user.

Figure 2:
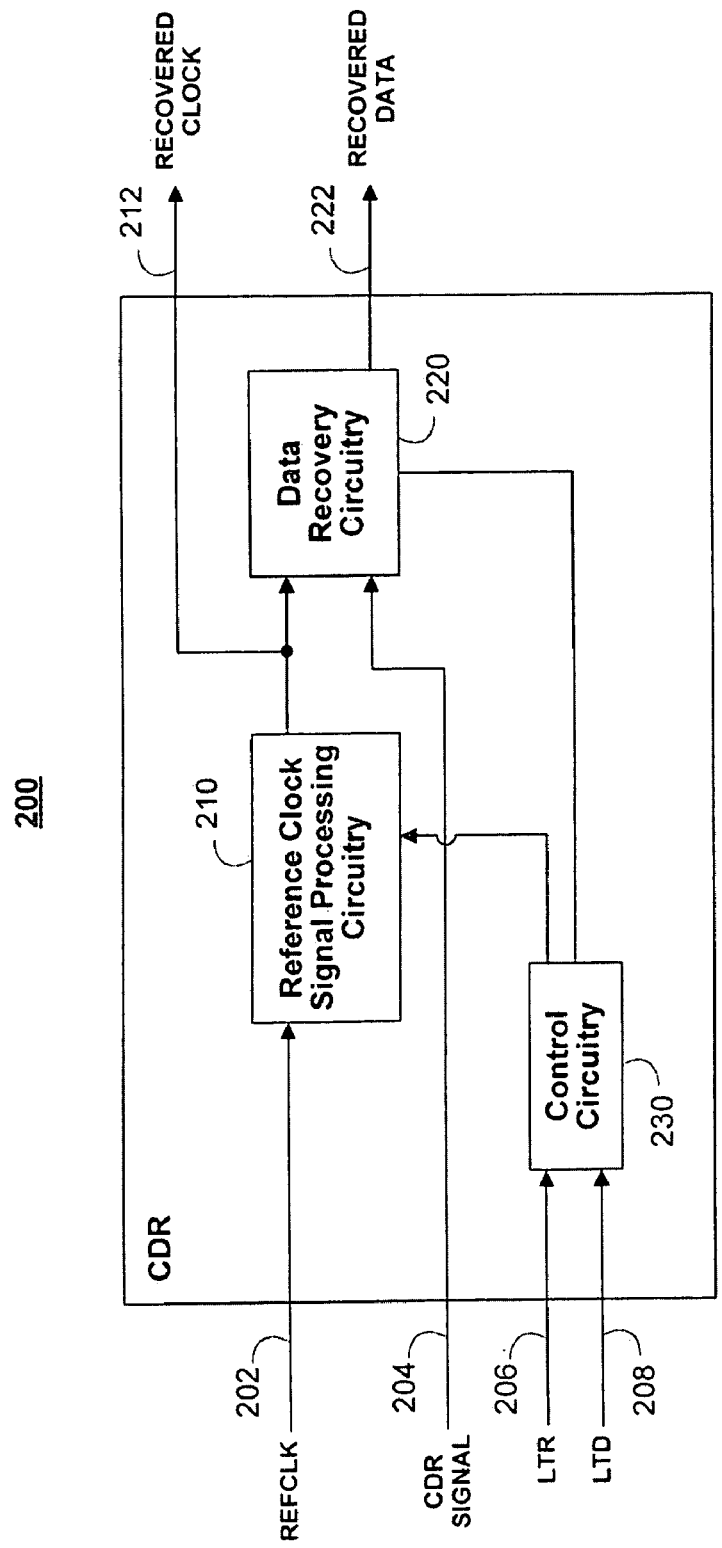
FIGS. 2-3 are simplified block diagrams of illustrative embodiments of CDR circuitry in accordance with the invention.
Figure 3:
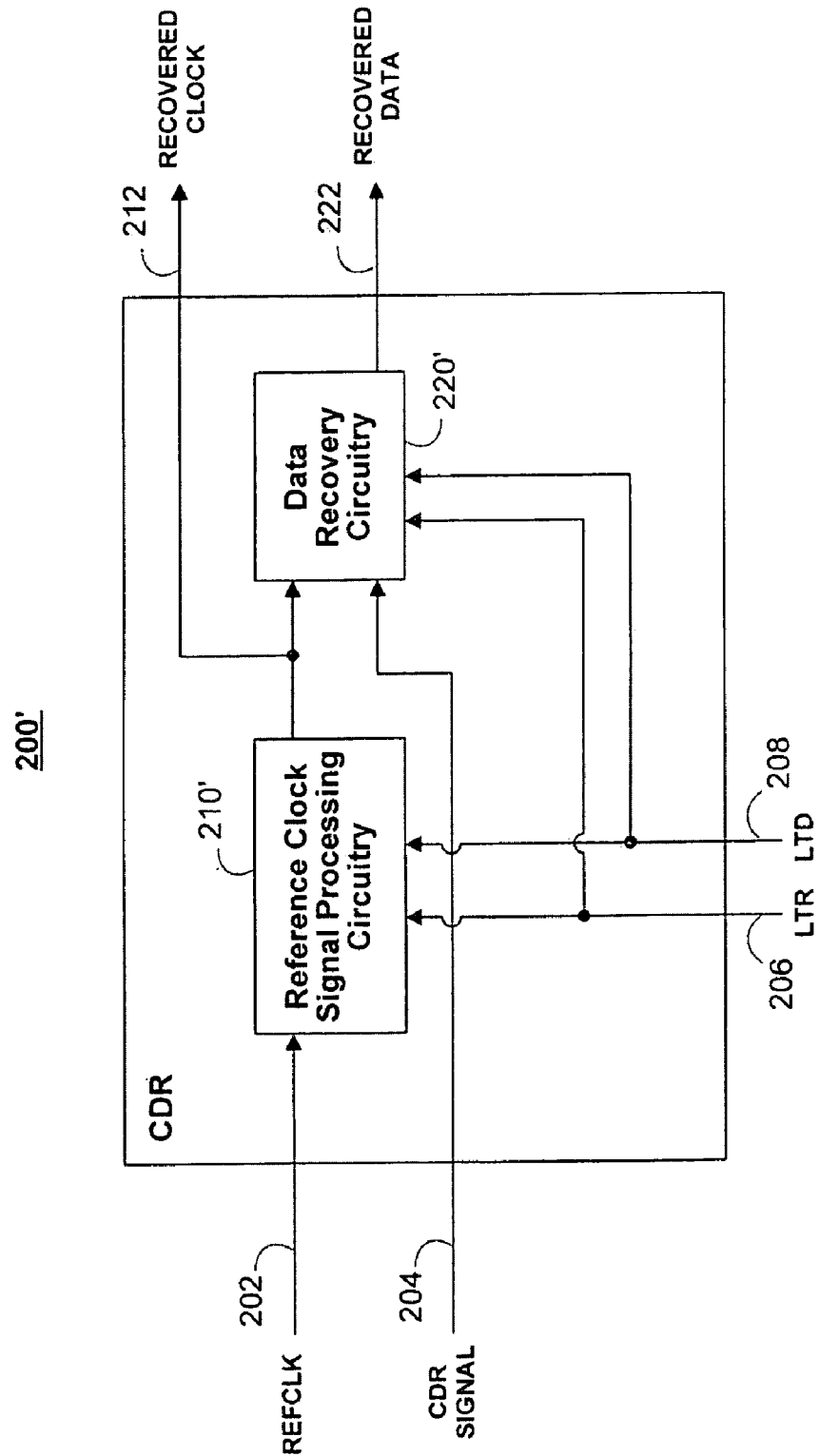

FIGS. 2-3 show illustrative embodiments of CDR receiver circuitry 200. CDR receiver circuitry 200 can be, in one embodiment, CDR circuitry 140 in receiver 130. CDR receiver circuitry 200 includes reference clock signal processing circuitry 210 and data recovery circuitry 220. Circuitry 210, which processes data during reference clock mode, receives as input a reference clock (REFCLK) signal 202. Circuitry 210 processes the input to generate a recovered clock signal 212 that is similar in phase and frequency to the phase and frequency of reference clock signal 202. Although shown as single signals, REFCLK signal 202 and CDR signal 204 can each be differential signals.

Circuitry 220, which processes data during data mode, receives as input a recovered clock signal 212 generated from circuitry 210 and a CDR data signal 204. Circuitry 220 adjusts the phase of recovered clock signal 212 to align to CDR signal 204. The phase-adjusted recovered clock signal is used to recover the clock signal embedded in CDR data signal 204, which is then used to recover the data from CDR data signal 204. Although circuitry 210 and 220 are shown as separate circuits, circuitry 210 and 220 can be combined to share similar circuitry, can be integrated into a single circuit, or any other suitable design.

CDR receiver circuitry 200 can be controlled by two signals: an LTR signal 206 and an LTD signal 208. In one embodiment, LTR signal 206 and LTD signal 208 are sent as input to control circuitry 230 (FIG. 2). Control circuitry 230 selects one of circuitry 210 or 220 to process data. For example, when LTR signal 206 and LTD signal 208 are both set to logic 0, control circuitry 230 can direct the automatic processing of data in circuitry 210 and 220 (i.e., to automatically switch between reference clock mode and data mode). When LTR signal 206 is set to logic 1 and LTD signal 208 is set to logic 0, control circuitry 230 can direct only circuitry 210 to process data (i.e., reference clock mode). When LTR signal 206 is set to either logic 0 or logic 1 and LTD signal 208 is set to logic 1, control circuitry 230 can direct only circuitry 220 to process data (i.e., data mode). In another embodiment, LTR signal 206 and LTD signal 208 are sent as input directly to circuitry 210' and 220' (FIG. 3). Circuitry 210' and 220' may each have control circuitry that directs the processing of data in their respective circuitry.

Although not shown in FIGS. 2-3, CDR circuitry 200 can include other suitable circuitry and signals that are used in connection with processing data during reference clock mode and data mode. CDR circuitry 200 can include, for example, control signals to direct the reset of some or all the circuitry, control signals to set circuitry to different values, and additional output signals that allow a PLD, circuitry external to a PLD, or a user to monitor the outputs during the different modes of data processing.

Figure 4:
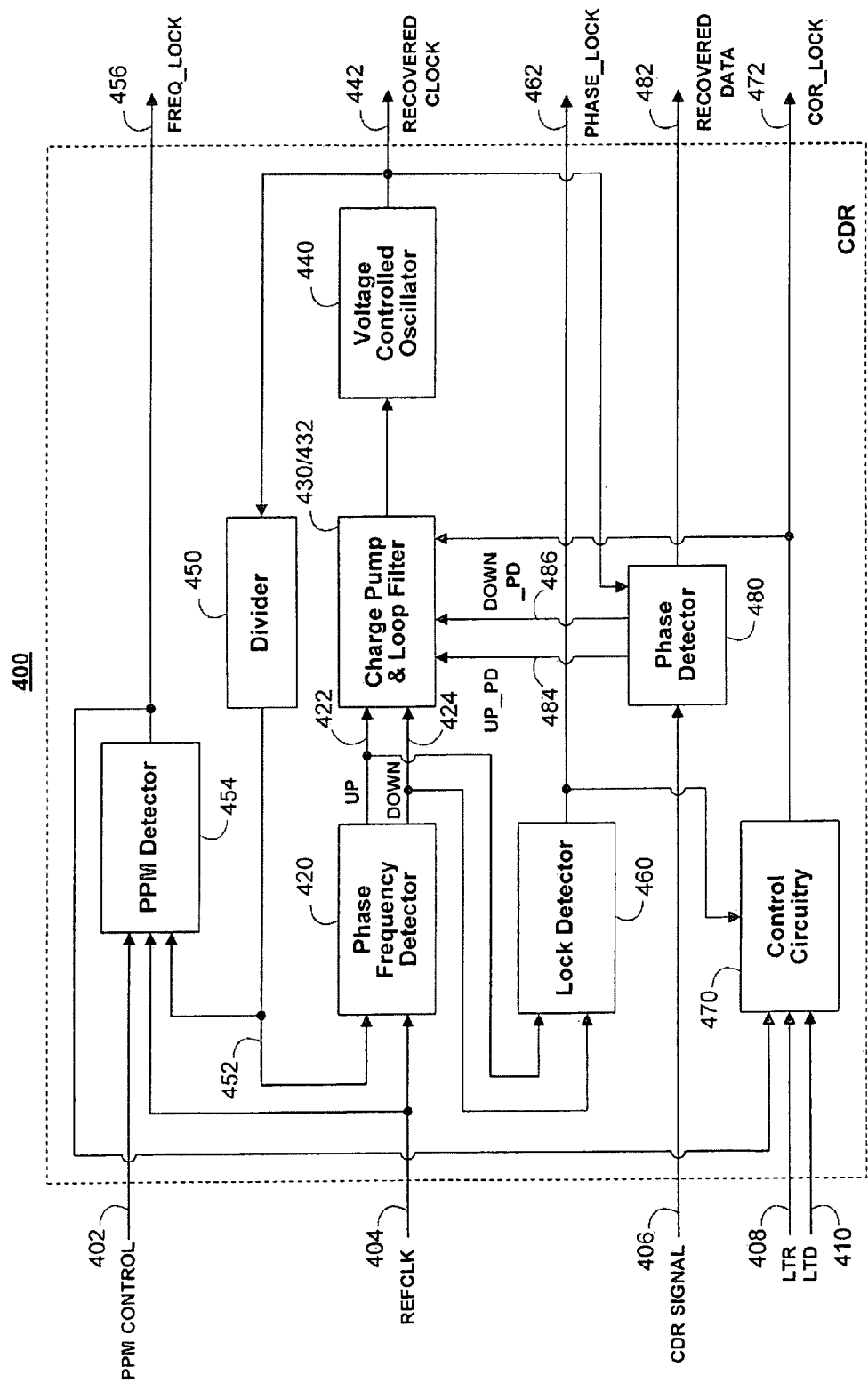
FIG. 4 is a more detailed block diagram of an illustrative embodiment of CDR circuitry in accordance with the invention.

FIG. 4 shows in more detail an illustrative embodiment of CDR receiver circuitry 400. CDR receiver circuitry 400 can be, in one embodiment, CDR circuitry 140 in receiver 130. CDR receiver circuitry 400 includes a phase frequency detector 420 which receives as input a reference clock (REFCLK) signal 404 and an output signal 452 of a divider circuit 450. Phase frequency detector 420 compares the phase and frequency of the two signals it receives and outputs one of two signals, up signal 422 and down signal 424, which are indicative of whether the output signal 452 of divider circuit 450 should be speeded up or slowed down to better match the phase and frequency of REFCLK signal 404. Up signal 422 and down signal 424 are sent as input to a charge pump 430. The output of charge pump 430 is sent as input to a loop filter 432. Charge pump and loop filter 430/432 produce a voltage controlled oscillator (VCO) current control signal used to control VCO 440. Although charge pump and loop filter 430/432 are shown in a single block for clarity, charge pump and loop filter 430/432 can be separate components. VCO 440 outputs a recovered clock signal 442 that better matches REFCLK signal 404 with respect to phase and frequency. The VCO output signal 442 is applied to divider circuit 450 which divides the VCO output signal frequency by a predetermined scale factor W to produce signal 452 which is input to phase frequency detector 420.

REFCLK signal 404, signal 452, and a parts per million (PPM) control signal 402 are input to a PPM detector 454 which determines whether signal 452 has a frequency that is similar to the frequency of REFCLK signal 404. PPM detector 454 computes a frequency difference between REFCLK signal 404 and signal 452 and compares the frequency difference to a PPM setting. The PPM setting can be dynamically adjustable using PPM control signal 402. PPM control signal 402 can be used to signal whether to increase or decrease the current PPM setting stored in PPM detector 454 or to set a new PPM setting as the current PPM setting stored in PPM detector 454. If the frequency difference is at or less than the current PPM setting, PPM detector 454 outputs a frequency lock (FREQ_LOCK) signal 456 (e.g., sets signal 456 to logic 1).

Up signal 422 and down signal 424 generated from phase frequency detector 420 are also sent as input to a lock detector 460 which determines whether signal 452 has a phase that is similar to the phase of REFCLK signal 404. For example, when up signal 422 and down signal 424 are both logic 0, this may indicate that signal 452 does not have to be speeded up or slowed down. When this occurs, lock detector 460 can output a phase lock (PHASE_LOCK) signal 462 (e.g., sets signal 462 to logic 1).

FREQ_LOCK signal 456, PHASE_LOCK signal 462, a lock-to-reference (LTR) signal 408, and a lock-to-data (LTD) signal 410 are input to control circuitry 470. Control circuitry 470 directs the processing of data in CDR circuitry 400 which can support a fixed data rate and a changing data rate. In one embodiment, when CDR circuitry 400 supports a fixed data rate, which can be indicated by LTR signal 408 and LTD signal 410 both being set to logic 0, control circuitry 470 determines whether FREQ_LOCK signal 456 and PHASE_LOCK signal 462 both go to logic 1, indicating that recovered clock signal 442 is similar in phase and frequency to REFCLK signal 404. If signals 456 and 462 both go to logic 1, control circuitry 470 sets a CDR_LOCK signal 472 to logic 1 and CDR circuitry 400 switches to data mode. If signals 456 and 462 do not both go to logic 1, control circuitry 470 sets CDR_LOCK signal 472 to logic 0 and CDR circuitry 400 remains in reference clock mode.

In another embodiment, when CDR circuitry 400 supports a changing data rate, control circuitry 470 determines whether CDR circuitry 400 is to operate in reference clock mode or data mode, which can be indicated by LTR signal 408 and LTD signal 410. If LTR signal 408 is logic 1 and LTD signal 410 is logic 0, control circuitry 470 sets CDR_LOCK signal 472 to logic 0 and CDR circuitry 400 enters reference clock mode. If LTR signal 408 is logic 0 or 1 and LTD signal 410 is logic 1, control circuitry 470 sets CDR_LOCK signal 472 to logic 1 and CDR circuitry 400 enters data mode.

CDR_LOCK signal 472 is sent as input to charge pump 430. Charge pump 430 can include circuitry that directs the processing of data in either reference clock mode or data mode based on the logic value of CDR_LOCK signal 472. When CDR_LOCK signal 472 is logic 0, charge pump 430 accepts as input up signal 422 and down signal 424 from phase frequency detector 420 for processing in reference clock mode. When CDR_LOCK signal 472 is logic 1, charge pump 430 accepts as input an up_pd signal 484 and a down_pd signal 486 from a phase detector 480 for processing in data mode.

Phase detector 480 accepts as input CDR signal 406 and recovered clock signal 442. Phase detector 480 compares the phases of recovered clock signal 442 and CDR signal 406 and outputs one of two signals, up_pd signal 484 and down_pd signal 486, which are indicative of whether recovered clock signal 442 needs to be speeded up or slowed down to better match the phase of CDR signal 406. Up_pd signal 484 and down_pd signal 486 are sent as input to charge pump 430 described above. Charge pump and loop filter 430/432 outputs a signal that is sent as input to VCO 440 to produce recovered clock signal 442 whose phase has been adjusted based on up_pd signal 484 and down_pd signal 486. Phase detector 480, using recovered clock signal 442, produces a recovered data signal 482 based on CDR signal 406.

The flow of data during reference clock mode and data mode goes through two different loops in CDR circuitry 400. During reference clock mode, data is processed in the following path: phase frequency detector 420, charge pump and loop filter 430/432, VCO 440, divider 450, and back to phase frequency detector 420 where the path begins again. CDR circuitry 400 that supports a fixed data rate continues to process data in this path until PPM detector 454 sets FREQ_LOCK signal 456 to logic 1 and lock detector 460 sets PHASE_LOCK signal 462 to logic 1, or at another suitable time. CDR circuitry 400 that supports a changing data rate continues to process data in this path until LTR signal 408 is set to logic 0 or 1 and LTD signal 410 is set to logic 1, or at another suitable time. In one embodiment, LTR signal 408 and LTD signal 410 can be set accordingly by a PLD, by circuitry external to the PLD, or by user input in response to detecting that FREQ_LOCK signal 456 and PHASE_LOCK signal 462 have both gone to logic 1.

During data mode, data is processed in the following path: phase detector 480, charge pump and loop filter 430/432, VCO 440, and back to phase detector 480 where the path begins again. CDR circuitry 400 that supports a fixed data rate continues to process data in this path until FREQ_LOCK signal 456 goes to logic 0, or at another suitable time. CDR circuitry 400 that supports a changing data rate continues to process data in this path until LTR signal 408 is set to logic 1 and LTD signal 410 is set to logic 0, or at another suitable time. In one embodiment, LTR signal 408 and LTD signal 410 can be set accordingly by a PLD, by circuitry external to the PLD, or by user input in response to detecting that FREQ_LOCK signal 456 has gone to logic 0.

Although not shown in FIG. 4, CDR circuitry 400 can include other suitable circuitry and signals. CDR circuitry 400 can include, for example, control signals to direct the reset of some or all the circuitry, control signals to set circuitry to different values, and additional output signals that allow a PLD, circuitry external to a PLD, or a user to monitor the outputs during the different modes of data processing.

Figure 5:
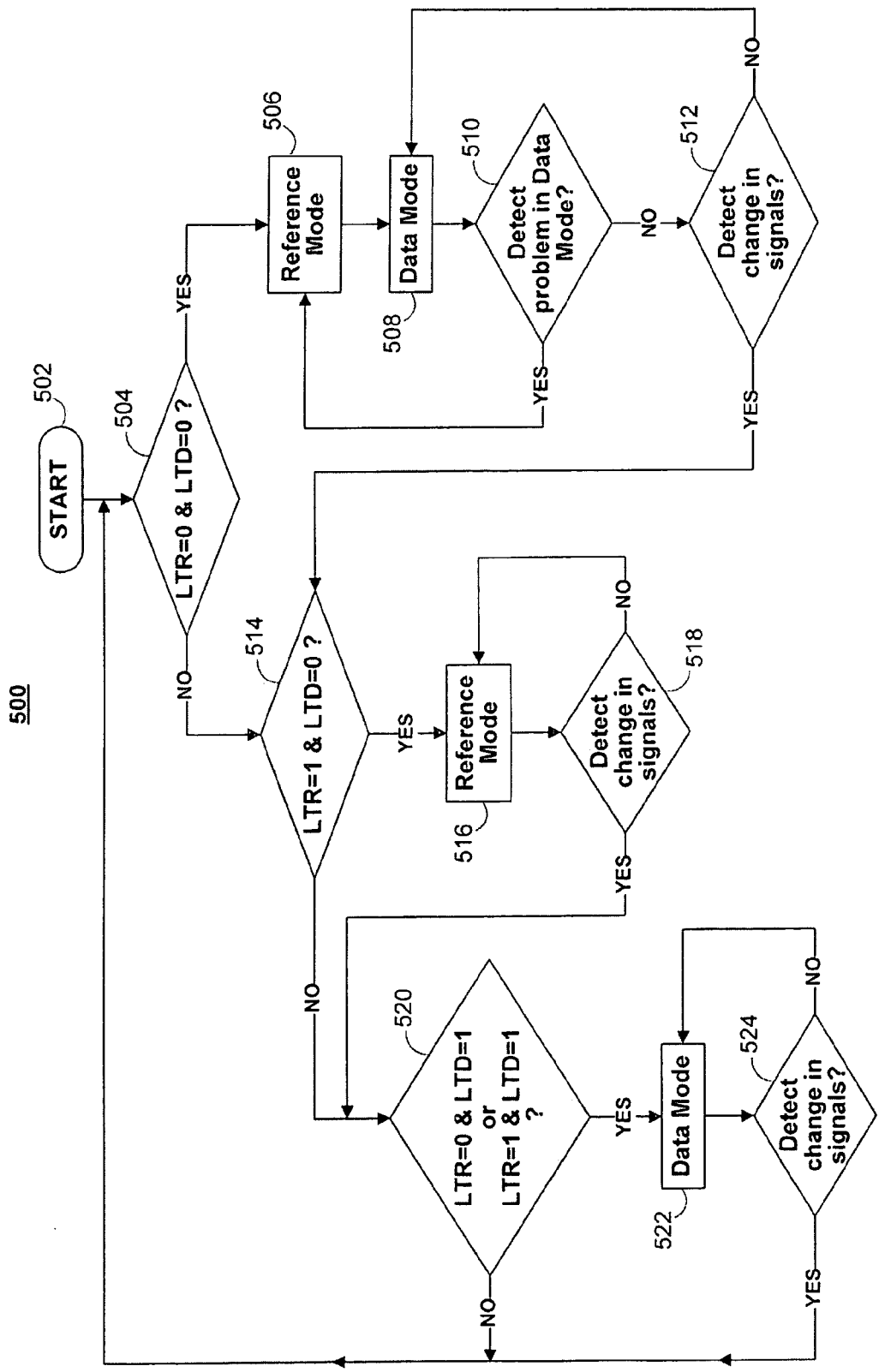
FIG. 5 is a flow diagram of an illustrative process of CDR circuitry having dynamic support for changing data rates in accordance with one embodiment of the invention.

FIG. 5 is a flow diagram of a process 500 for providing CDR circuitry with dynamic support for changing data rates. Process 500 begins at step 502. At step 504, process 500 determines whether the LTR signal and the LTD signal are both logic 0 (e.g., indicating a fixed data rate). If both signals are logic 0, process 500 moves to step 506 where the process enters reference mode. At step 508, process 500 automatically switches to data mode, which can occur when a PPM detector outputs a signal. At step 510, process 500 determines whether a problem is detected in data mode. If a problem is detected, process 500 switches back to reference mode at step 506. If no problem is detected, process 500 moves to step 512 where process 500 determines whether a change in logic of the signals (e.g., LTR and/or LTD) has been detected. If no change is detected, process 500 returns to step 508 where the process remains in data mode.

If a change is detected at step 512, or if the LTR signal and the LTD signal are not both logic 0 at step 504, process 500 moves to step 514 where the process determines whether the LTR signal is logic 1 and the LTD signal is logic 0 (e.g., indicating reference mode). If the LTR signal is logic 1 and the LTD signal is logic 0, process 500 moves to step 516 where the process enters reference mode. At step 518, process 500 determines whether a change in logic of the signals (e.g., LTR and/or LTD) has been detected. If no change is detected, process 500 returns to step 516 where the process remains in reference mode.

If a change is detected at step 518, or if the logic of the signals is not as specified in step 514, process 500 moves to step 520 where the process determines whether the LTR signal is logic 0 or logic 1 and the LTD signal is logic 1. If the LTR signal is logic 0 or logic 1 and the LTD signal is logic 1, process 500 moves to step 522 where the process enters data mode. At step 524, process 500 determines whether a change in logic of the signals is detected. If no change is detected, process 500 returns to step 522 where the process remains in data mode.

If a change is detected at step 522, or if the logic of the signals is not as specified in step 520, process 500 returns to step 504. Although the invention is primarily described herein in the context of the LTR signal and the LTD signal having the specified logic values that correspond to particular modes of operation, different combinations of logic values may correspond to different modes of operation and other suitable signals may also be used.

Different embodiments of FIG. 5 can also be implemented. In one embodiment, when a change in signals is detected at steps 512, 518, or 524, process 500 can return to any one or combination of steps 504, 514, and 520. In another embodiment, rather than having separate steps 512, 518, and 524 for detecting when a change in signals occurs, process 500 can continually monitor the signals to detect a change in signals. In yet another embodiment, step 510 for detecting when a problem occurs in data mode and step 512 for detecting when a change in signals occurs can be combined into a single step. In a further embodiment, steps 504, 514, and 520 for determining the logic values of the LTR signal and the LTD signal can be in any suitable order or alternatively, can be combined into a single step. Any other suitable embodiment or combination of embodiments can be used to implement process 500.

Figure 6:
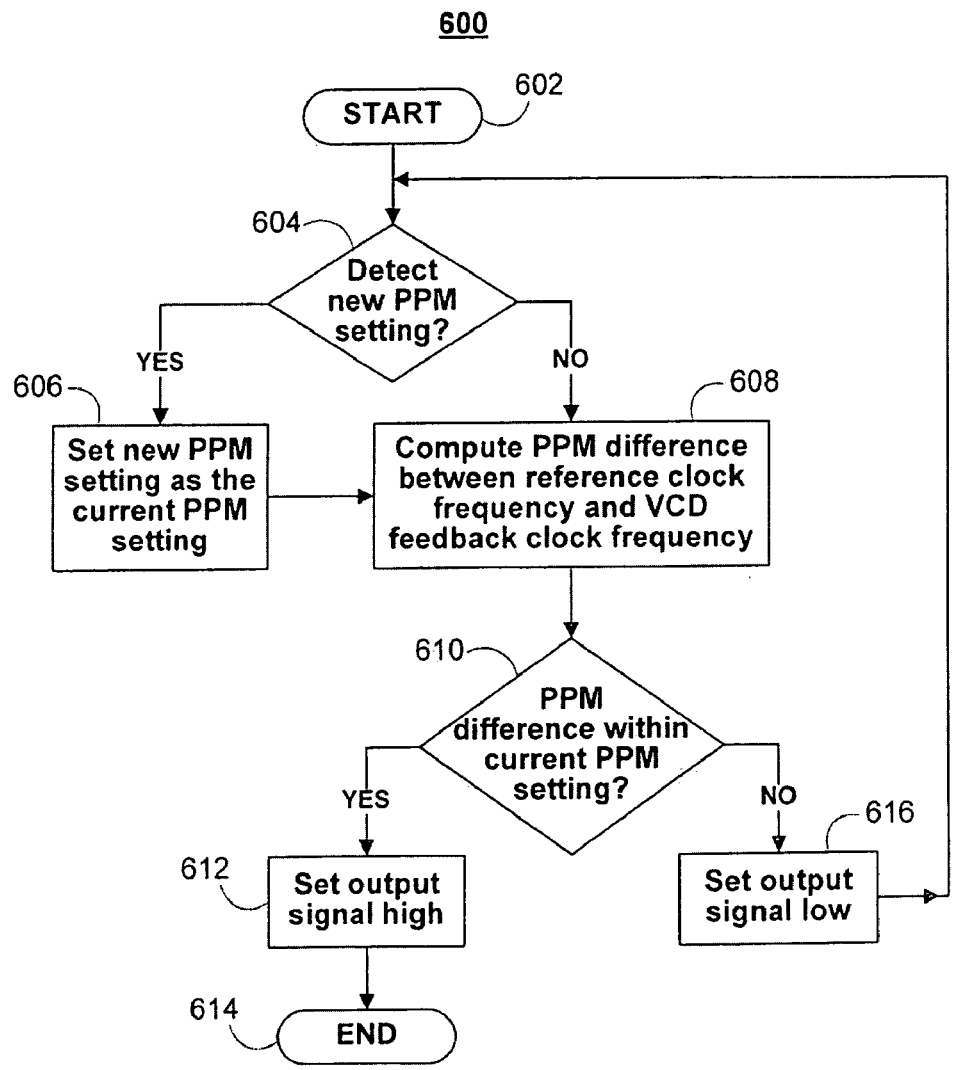
FIG. 6 is a flow diagram of an illustrative process of CDR circuitry having a dynamically adjustable PPM detector in accordance with one embodiment of the invention.

FIG. 6 is a flow diagram of a process 600 for providing a dynamically adjustable PPM detector. Process 600 begins at step 602. At step 604, the process determines whether a new PPM setting is detected. If a new PPM setting is detected, process 600 moves to step 606 where the new PPM setting is set as the current PPM setting. If a new PPM setting is not detected at step 604, or after the new PPM setting is set as the current PPM setting at step 606, process 600 moves to step 608 where the process computes a PPM difference between the reference clock frequency and the frequency of the clock signal generated by the CDR circuitry. At step 610, process 600 determines whether the computed PPM difference is at or within the current PPM setting. If the PPM difference is at or within the current PPM setting, process 600 moves to step 612 where an output signal is set high and the process ends at step 614. For CDR circuitry supporting a fixed data rate, step 612 would indicate the completion of reference mode and the process would move to data mode. For CDR circuitry supporting a changing data rate, the process would remain in reference mode until the control signals are set to indicate data mode (e.g., LTR signal is set to logic 0 or logic 1 and LTD signal is set to logic 1). If the PPM difference is outside the current PPM setting, process 600 moves to step 616 where an output signal is set low and process 600 returns to step 604.

Figure 7:
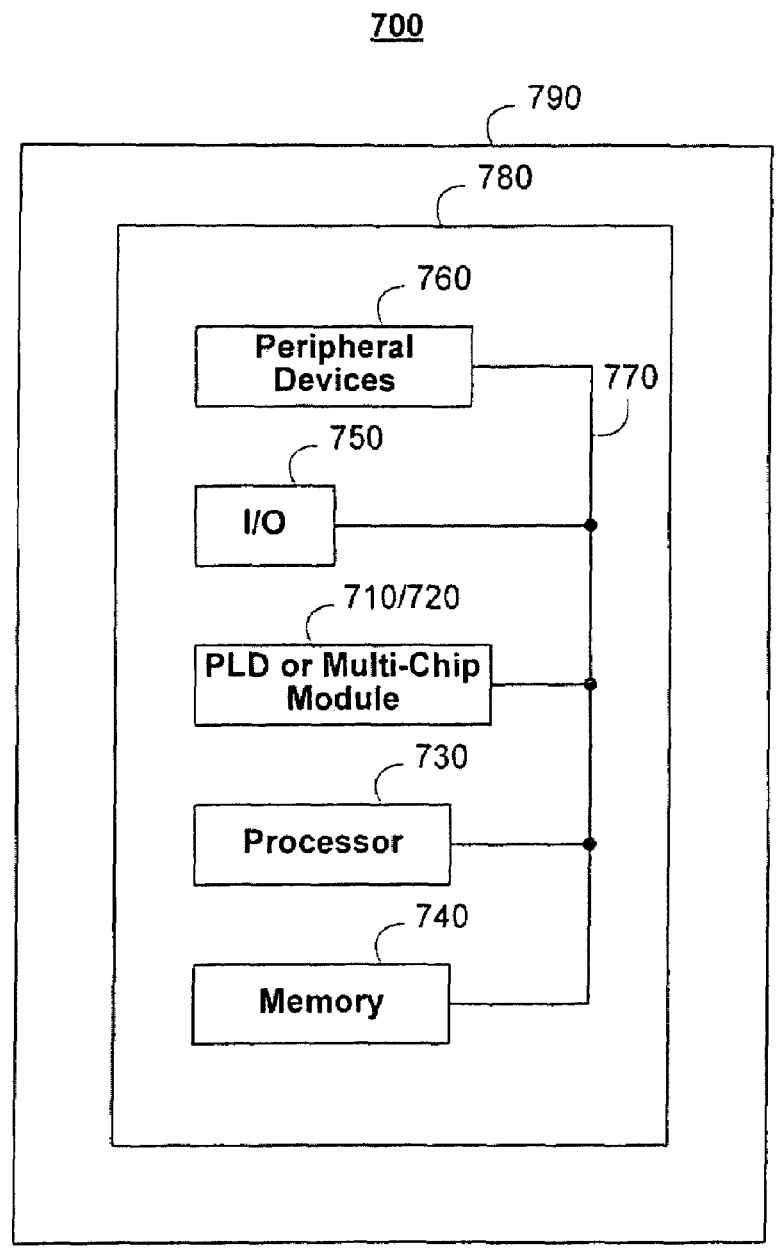
FIG. 7 is a simplified block diagram of an illustrative system employing circuitry in accordance with the invention.

FIG. 7 illustrates a PLD 710 or multi-chip module 720 of this invention in a data processing system 700. Data processing system 700 may include one or more of the following components: a processor 730; memory 740; I/O circuitry 750; and peripheral devices 760. These components are coupled together by a system bus or other interconnections 770 and are populated on a circuit board 780 which is contained in an end-user system 790. Any of the interconnections between element 710/720 and any other elements may be made using the above-described CDR signaling.

System 700 can be used in a wide variety of applications, such as computer networking, data networking, instrumentation, video processing, digital signal processing, or any other application where the advantage of using programmable or reprogrammable logic is desirable. PLD/module 710/720 can be used to perform a variety of different logic functions. For example, PLD/module 710/720 can be configured as a processor or controller that works in cooperation with processor 730. PLD/module 710/720 may also be used as an arbiter for arbitrating access to a shared resource in system 700. In yet another example, PLD/module 710/720 can be configured as an interface between processor 730 and one of the other components in system 700. It should be noted that system 700 is only exemplary, and that the true scope and spirit of the invention should be indicated by the following claims.

Various technologies can be used to implement PLDs 710 or multi-chip modules 720 having the features of this invention, as well as the various components of those devices (e.g., the above-described PLCs and programmable function control elements ("FCEs") that control the PLCs). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. PLCs and other circuit components can be controlled by various, programmable, function control elements ("FCEs"). (With certain implementations (e.g., fuses and metal optional links) separate FCE devices are not required.) FCEs can also be implemented in any of several different ways. For example, FCEs can be SRAMs, DRAMs, magnetic RAMs, ferro-electric RAMs, first-in first-out ("FIFO") memories, EPROMs, EEPROMs, function control registers, ferro-electric memories, fuses, antifuses, or the like. From the various examples mentioned above it will be seen that this invention is applicable to both one-time-only programmable and reprogrammable devices.

Thus it is seen that dynamic support for changing data rates and a dynamically adjustable PPM detector are provided on CDR circuitry. One skilled in the art will appreciate that the invention can be practiced by other than the prescribed embodiments, which are presented for purposes of illustration and not of limitation, and the invention is limited only by the claims which follow.

What is claimed is:

1. Apparatus for receiving and processing a clock data recovery (CDR) signal comprising:
    reference clock signal processing circuitry that receives as input a reference clock signal and is operative to produce a recovered clock signal having a phase and frequency which respectively corresponds to a phase and frequency of the reference clock signal;
    data recovery circuitry that receives as input the recovered clock signal and the CDR signal and is operative to phase align the recovered clock signal to the CDR signal, to use the recovered clock signal to recover clock information embedded in the CDR signal, and to use the clock information to recover data information in the CDR signal;
    a dynamically adjustable parts per million (PPM) detector that receives as input the reference clock signal, the recovered clock signal, and a PPM control signal operative to output a signal when a frequency difference between the reference clock signal and the recovered clock signal is within a dynamically controllable frequency setting controlled by the PPM control signal; and
    control circuitry that receives as input a first signal, a second signal, and the output signal of the PPM detector and is operative to control the reference clock signal processing circuitry and the data recovery circuitry.

2. The apparatus of claim 1 wherein the reference clock signal processing circuitry comprises a divider circuit that divides the recovered clock signal by a predetermined scale factor.

3. The apparatus of claim 2 wherein the reference clock signal processing circuitry further comprises:
    a phase frequency detector that compares the phase and frequency of the reference clock signal and an output signal of the divider circuit, and outputs a signal indicative of whether the output signal of the divider circuit should be speeded up or slowed down to better match the phase and frequency of the reference clock signal.

4. The apparatus of claim 3 wherein the reference clock signal processing circuitry further comprises:
    a charge pump that receives as input the output signal of the phase frequency detector; and
    a loop filter that receives as input the output of the charge pump to produce a voltage controlled oscillator current control signal.

5. The apparatus of claim 4 wherein the reference clock signal further comprises:
    a voltage controlled oscillator that receives as input the voltage controlled oscillator current control signal and outputs the recovered clock signal that better matches the phase and frequency of the reference clock signal.

6. The apparatus of claim 3 wherein the reference clock signal processing circuitry further comprises:
    a lock detector that receives as input the output signal of the phase frequency detector and outputs a signal indicative of whether a phase of the output signal of the divider circuit is similar to the phase of the reference clock signal.

7. The apparatus of claim 1 wherein the data recovery circuitry further comprises a phase detector that compares a phase of the recovered clock signal and the CDR signal and outputs a signal indicative of whether the recovered clock signal needs to be speeded up or slowed down to better match the phase of the CDR signal.

8. The apparatus of claim 7 wherein the data recovery circuitry further comprises:
    a charge pump that receives as input the output signal of the phase detector; and
    a loop filter that receives as input the output of the charge pump to produce a voltage controlled oscillator current control signal.

9. The apparatus of claim 8 wherein the data recovery circuitry further comprises a voltage controlled oscillator that receives as input the voltage controlled oscillator current control signal and outputs the recovered clock signal that better matches the phase of the CDR signal.

10. The apparatus of claim 1 wherein when the first signal is set to a first logic value and the second signal is set to a second logic value, the control circuitry:
    first, directs operation of the reference clock signal processing circuitry; and
    second, directs operation of the data recovery circuitry in response to receiving an output signal from the reference clock signal processing circuitry indicating that the recovered clock signal has a phase and frequency similar to the phase and frequency of the reference clock signal.

11. A digital processing system comprising:
    processing circuitry;
    a memory coupled to the processing circuitry; and
    apparatus as defined in claim 1 coupled to the processing circuitry and the memory.

12. A printed circuit board on which is mounted the apparatus as defined in claim 1.

13. The printed circuit board defined in claim 12 further comprising:
    a memory mounted on the printed circuit board and coupled to the apparatus.

14. The printed circuit board defined in claim 12 further comprising:
    processing circuitry mounted on the printed circuit board and coupled to the apparatus.

15. The apparatus of claim 1 wherein the frequency setting controlled by the PPM control signal is dynamically adjustable and set by at least one of programmable logic resource core circuitry, circuitry external to programmable logic resource core circuitry, or user input.

16. The apparatus of claim 1 wherein when the first signal is set to a first logic value and the second signal is set to a second logic value, the control circuitry:
    first, directs operation of the reference clock signal processing circuitry when the output signal of the PPM detector indicates that the frequency difference is not within the predetermined frequency setting; and
    second, directs operation of the data recovery circuit when the output signal of the PPM detector indicates that the frequency difference is within the predetermined frequency setting.

17. The apparatus of claim 1 wherein when the first signal is set to a first logic value and the second signal is set to a second logic value, the control circuitry directs operation of the reference clock signal processing circuitry.

18. The apparatus of claim 1 wherein when the first signal is set to a first logic value and the second signal is set to a second logic value, the control circuitry directs operation of the data recovery circuitry.

19. The apparatus of claim 1 wherein the first signal and the second signal are set by at least one of programmable logic resource core circuitry, circuitry external to programmable logic resource core circuitry, or user input.

20. The apparatus of claim 1 wherein the PPM control signal is adjusted to control the dynamically controllable frequency setting in response to detecting a change in a data rate of the CDR signal.

21. The apparatus of claim 1 wherein the PPM control signal is adjusted to control the dynamically controllable frequency setting in response to detecting a change in a protocol of the CDR signal.

22. The apparatus of claim 1 wherein the PPM control signal is adjusted to control the dynamically controllable frequency setting in order to optimize the performance of the data recovery circuitry.

23. A method for receiving and processing a clock data recovery (CDR) signal comprising:
 receiving a reference clock signal and a CDR signal associated with a signaling protocol;
 processing the reference clock signal and the CDR signal to recover data information from the CDR signal;
 producing a recovered clock signal having a phase and frequency which respectively corresponds to a phase and frequency of the reference clock signal;
 determining when a frequency difference between the reference clock signal and the recovered clock signal is within a dynamically controllable frequency setting controlled by a PPM control signal;
 receiving a different reference clock signal and a different CDR signal associated with a different signaling protocol; and
 processing the different reference clock signal and the different CDR signal to recover data information from the different CDR signal, wherein the processing is controlled by a first signal, a second signal, and the frequency difference.

24. The method of claim 23 wherein processing the reference clock signal and the CDR signal comprises:
 processing in reference clock mode to produce the recovered clock signal; and
 processing in data mode to phase align the recovered clock signal to the CDR signal, to use the recovered clock signal to recover clock information embedded in the CDR signal, and to use the clock information to recover the data information in the CDR signal.

25. The method of claim 24 further comprising automatically switching from processing in reference clock mode to processing in data mode when the first signal is set to a first logic value, when the second signal is set to a second logic value, and when the frequency difference is within the dynamically controllable frequency setting.

26. The method of claim 24 further comprising automatically switching from processing in data mode to processing in reference clock mode when the first signal is set to a first logic value, when the second signal is set to a second logic value, and when a problem is detected during the processing in data mode.

27. The method of claim 24 further comprising processing in reference clock mode when the first signal is set to a first logic value and the second signal is set to a second logic value.

28. The method of claim 24 further comprising processing in data mode when the first signal is set to a first logic value and the second signal is set to a second logic value.

29. The method of claim 23 wherein processing the different reference clock signal and the different CDR signal comprises:
 processing in reference clock mode to produce a recovered clock signal having a phase and frequency which respectively corresponds to a phase and frequency of the reference clock signal; and
 processing in data mode to phase align the recovered clock signal to the different CDR signal, to use the recovered clock signal to recover clock information embedded in the different CDR signal, and to use the clock information to recover the data information in the different CDR signal.

30. The method of claim 23 further comprising adjusting the PPM control signal to control the dynamically controllable frequency setting in response to detecting a change in a data rate of the CDR signal.

31. The method of claim 23 further comprising adjusting the PPM control signal to control the dynamically controllable frequency setting in response to detecting a change in a protocol of the CDR signal.

32. The method of claim 23 further comprising adjusting the PPM control signal to control the dynamically controllable frequency setting in order to optimize the performance of recovering information from the CDR signal.

* * * * *